(12) United States Patent
Omori et al.

(10) Patent No.: US 11,982,594 B2
(45) Date of Patent: May 14, 2024

(54) INSPECTION SYSTEM

(71) Applicant: Daifuku Co., Ltd., Osaka (JP)

(72) Inventors: Kazuya Omori, Hinocho (JP); Ryo Yamashita, Hinocho (JP); Naoto Okawara, Hinocho (JP); Kyohei Miyamae, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 101 days.

(21) Appl. No.: 17/729,610

(22) Filed: Apr. 26, 2022

(65) Prior Publication Data
US 2022/0341810 A1 Oct. 27, 2022

(30) Foreign Application Priority Data
Apr. 27, 2021 (JP) .................. 2021-075301

(51) Int. Cl.
*G01M 3/32* (2006.01)
*H01L 21/677* (2006.01)

(52) U.S. Cl.
CPC ........ *G01M 3/3209* (2013.01); *G01M 3/3254* (2013.01); *H01L 21/67769* (2013.01)

(58) Field of Classification Search
CPC .... G01M 3/0007; G01M 3/32; G01M 3/3209; G01M 3/3254
See application file for complete search history.

(56) References Cited

U.S. PATENT DOCUMENTS

| 9,541,534 B2* | 1/2017 | Otsuka ............. H01L 21/67769 |
| 2015/0000372 A1 | 1/2015 | Otsuka et al. | |

FOREIGN PATENT DOCUMENTS

| JP | 612936 U | 2/1994 |
| JP | 201512040 A | 1/2015 |
| JP | 2016127228 A | 7/2016 |

* cited by examiner

*Primary Examiner* — Erika J. Villaluna
(74) *Attorney, Agent, or Firm* — The Webb Law Firm

(57) ABSTRACT

An inspection system inspects a flow of gas in a container storage facility that includes a placement table and a gas supply device to supply gas to the container. The inspection system includes: an inspection unit placeable on the placement table, and a determiner. The gas supply device includes: a gas supply section located in the placement table to be connectable to the container inflow section of the container; a gas supply pipe; and a supply gas flow rate controller to control a flow rate of the gas supplied to the gas supply section through the gas supply pipe, so as to be equal to a predetermined supply gas flow rate. The inspection unit includes: an inspection inflow section connectable to the gas supply section, and an inflow rate measurer to measure an inflow rate of the gas flowing thereto from the inspection inflow section.

7 Claims, 3 Drawing Sheets

INSPECTION SYSTEM

CROSS-REFERENCE TO RELATED APPLICATION

This application claims priority to Japanese Patent Application No. 2021-075301 filed Apr. 27, 2021, the disclosure of which is hereby incorporated by reference in its entirety.

BACKGROUND OF THE INVENTION

1. Field of the Invention

The present invention relates to an inspection system for inspecting a gas flow in a container storage facility that includes: a placement table on which a container is placeable; and a gas supply device configured to supply gas to a container placed on the placement table.

2. Description of the Related Art

An example of such an inspection system is disclosed in JP 2016-127228A (hereinafter referred to as "Patent Document 1"). Hereinafter, in the description of the background technology, the reference numerals in Patent Document 1 are quoted in parentheses.

Patent Document 1 discloses a container storage facility (1) including: a gas supply section (30) located in a placement table (3) so as to be connectable to a container inflow section (24) of a container (F) placed on the placement table (3); an gas supply pipe (34) connected to the gas supply section (30); an supply gas flow rate controller (32) configured to control the flow rate of the gas supplied to the gas supply section (30) through the gas supply pipe; a gas exhaust section (31) located in the placement table (3) so as to be connectable to a container outflow section (26) of the container (F) placed on the placement table (3); and a gas exhaust pipe (35) connected to the gas exhaust section. An inspection system used in this container storage facility (1) includes a sensor (33) that detects the flow rate of the gas flowing through the gas exhaust pipe (35) (see FIGS. 1 and 2 of Patent Document 1).

The container (F) according to Patent Document 1 includes a main body (21) partially opened and a lid (22) located so as to close the opening of the main body. In the case where gas is supplied to the inside of such a container (F), if the gas is continuously supplied thereto even after the container (F) is saturated with the gas, the gas leaks from the gap between the main body (21) and the lid (22). At this time, if the container (F) is damaged, for example, the amount of gas leaking is large. Utilizing this fact, the inspection system according to Patent Document 1 determines that the gas flow is normal if the flow rate detected by the sensor (33) is no less than a predetermined threshold value, and determines that the gas flow is abnormal if the flow rate is less than the aforementioned threshold value.

By the way, the inspection system according to Patent Document 1 inspects the flow of gas on the presumption that the gas supply section (30) is properly connected to the container inflow section (24) and the gas exhaust section (31) is properly connected to the container outflow section (26). Therefore, if the gas supply section (30) is not properly connected to the container inflow section (24) due to an abnormality in the placement table (3) or misalignment of the container (F) on the placement table (3), or the gas exhaust section (31) is not properly connected to the container outflow section (26), the gas flow cannot be appropriately inspected.

SUMMARY OF THE INVENTION

In view of the foregoing, there is demand for the realization of an inspection system that can appropriately inspect the presence or absence of an abnormality in the placement table on which the container is placeable or misalignment of the container on the placement table.

The characteristic configuration of the inspection system in view of the above is as follows.

An inspection system that inspects a flow of gas in a container storage facility that includes: a placement table on which a container is placeable; and a gas supply device configured to supply the gas to the container placed on the placement table, the inspection system including:

an inspection unit that is placeable on the placement table; and a determiner, wherein the container includes a container inflow section in which an inflow port for the gas is formed, the gas supply device includes: a gas supply section located in the placement table so as to be connectable to the container inflow section of the container placed on the placement table; a gas supply pipe connected to the gas supply section; and a supply gas flow rate controller configured to control a flow rate of the gas so that the flow rate of the gas supplied to the gas supply section through the gas supply pipe is equal to a predetermined supply gas flow rate, the inspection unit includes: an inspection inflow section that is connectable to the gas supply section while the inspection unit is placed on the placement table; and an inflow rate measurer configured to measure an inflow rate that is a flow rate of the gas flowing thereto from the inspection inflow section, and the determiner is configured to determine a state of leakage of the gas from a junction of the gas supply section and the inspection inflow section based on a difference between the supply gas flow rate and the inflow rate.

With this characteristic configuration, when the inspection unit is placed on the placement table instead of a container, gas flows through the gas supply pipe, the gas supply section, and the inspection inflow section in the stated order. At this time, if the gas supply section and the inspection inflow section are not properly connected to each other, the amount of gas leaked from the junction of the gas supply section and the inspection inflow section is larger and accordingly the inflow rate is smaller compared to when the gas supply section and the inspection inflow section are properly connected to each other, if the supply gas flow rate is the same. Thus, it is possible to determine whether or not the gas supply section and the inspection inflow section are properly connected to each other, based on the difference between the supply gas flow rate and the inflow rate. Here, the inspection unit includes an inspection inflow section that is connectable to the gas supply section, instead of the container inflow section. Therefore, as described above, it is possible to appropriately inspect whether or not there is an abnormality in the placement table or misalignment of the container on the placement table by placing the inspection unit on the placement table instead of the container, and determining whether or not the gas supply section and the inspection inflow section are properly connected to each other.

The characteristic configuration of the inspection system is as follows.

An inspection system that inspects a flow of gas in a container storage facility that includes: a placement table on which a container is placeable; and a gas exhaust device configured to exhaust the gas from the container placed on the placement table, the inspection system including:

an inspection unit that is placeable on the placement table; and a determiner, wherein the container includes a container outflow section in which an outflow port for the gas is formed, the gas exhaust device includes: a gas exhaust section located in the placement table so as to be connectable to the container outflow portion of the container placed on the mounting table; an exhaust pipe connected to the gas exhaust section; and an exhaust gas flow rate controller configured to control a flow rate of the gas so that the flow rate of the gas flowing from the gas exhaust section to the gas exhaust pipe equals a predetermined exhaust gas flow rate, the inspection unit includes: an inspection outflow section that is connectable to the gas exhaust section while the inspection unit is placed on the placement table; and an outflow rate measurer configured to measure an outflow rate that is a flow rate of the gas flowing to the inspection outflow section, and the determiner is configured to determine a state of leakage of the gas from a junction of the gas exhaust section and the inspection outflow section based on a difference between the exhaust gas flow rate and the outflow rate.

With this characteristic configuration, when the inspection unit is placed on the placement table instead of a container, gas flows through the inspection outflow section, the gas exhaust section, and the gas exhaust pipe in the stated order. At this time, if the gas exhaust section and the inspection outflow section are not properly connected to each other, the amount of gas leaked from the junction of the gas exhaust section and the inspection outflow section is larger and accordingly the outflow rate is smaller compared to when the gas exhaust section and the inspection outflow section are properly connected to each other, if the exhaust gas flow rate is the same. Thus, with this characteristic configuration, it is possible to determine whether or not the gas exhaust section and the inspection outflow section are properly connected to each other, based on the difference between the exhaust gas flow rate and the outflow rate. Here, the inspection unit includes an inspection outflow section that is connectable to the gas exhaust section, instead of the container outflow section. Therefore, as described above, it is possible to appropriately inspect whether or not there is an abnormality in the placement table or misalignment of the container on the placement table by placing the inspection unit on the placement table instead of the container, and determining whether or not the gas exhaust section and the inspection outflow section are properly connected to each other.

DETAILED DESCRIPTION OF PREFERRED EMBODIMENTS

Hereinafter, an inspection system 100 according to an embodiment will be described with reference to the drawings. The inspection system 100 is a system that inspects a gas flow in a container storage facility 10.

Figure 1:
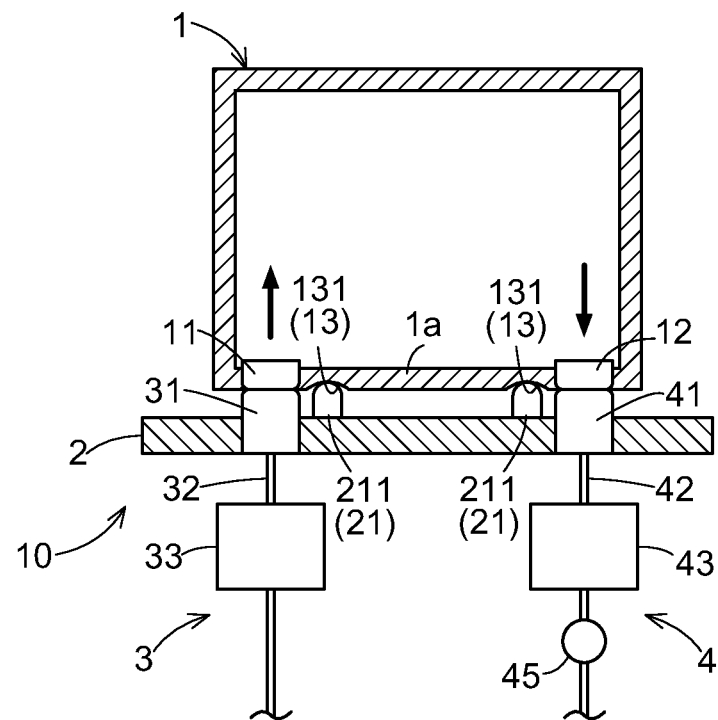
FIG. 1 is a schematic diagram showing an overall configuration of a container storage facility according to an embodiment.

First, the container storage facility 10 will be described. As shown in FIG. 1, in the present embodiment, the container storage facility 10 includes a placement table 2 on which a container 1 is placeable, a gas supply device 3 configured to supply gas to the container 1 placed on the placement table 2, and a gas exhaust device 4 that exhausts gas from the container 1 placed on the placement table 2.

The container 1 is an airtight container configured so that a predetermined gas (for example, a nitrogen gas, a clean air, or the like) can be supplied to the inside thereof. In the present embodiment, the container 1 includes a bottom portion 1a that faces the placement table 2 when the container 1 is placed on the placement table 2. In this example, the container 1 is a front-opening type airtight container called FOUP (Front Opening Unified Pod).

In the present embodiment, the container 1 includes a container inflow sections 11 in which a gas inflow port is formed, and container outflow sections 12 in which a gas outflow port is formed. In the present embodiment, the container inflow sections 11 and the container outflow sections 12 are fixed to the bottom portion 1a of the container 1 so as to penetrate through the bottom portion 1a in the vertical direction (the top-bottom direction in FIG. 1). That is to say, the container inflow sections 11 and the container outflow sections 12 are located so as to be in communication with the inside and the outside of the container 1. In addition, although not shown, in the present embodiment, a plurality of container inflow sections 11 and a plurality of container outflow sections 12 are provided.

The placement table 2 is configured to support the container 1 from below. In the present embodiment, the placement table 2 is formed in a plate shape that extends in the horizontal direction (the left-right direction in FIG. 1). In addition, in the present embodiment, although not shown, a plurality of placement tables 2 are arranged one after another in the vertical direction and the horizontal direction.

In the present embodiment, the placement table 2 includes a guiding section 21 that guides the container 1 to a predetermined position on the placement table 2. In this embodiment, the guiding section 21 includes a plurality of pins 211 formed so as to protrude upward from the upper surface of the placement table 2.

In the present embodiment, the container 1 includes a container guided section 13 that is configured to be guided by the guiding section 21 of the placement table 2. In the present embodiment, the container guided section 13 includes a plurality of container recesses 131 that respectively engage with the plurality of pins 211. The plurality of container recesses 131 are formed so that the lower surface of the bottom portion 1a of the container 1 is recessed upward.

The gas supply device 3 includes gas supply sections 31, gas supply pipes 32, and supply gas flow rate controllers 33. In the present embodiment, a plurality of gas supply sections 31, a supply pipe 32, and a supply gas flow rate controller 33 are provided for each of the plurality of placement tables 2. That is to say, in the present embodiment, the number of gas supply sections 31 provided is a multiple of the number of placement tables 2, and the number of gas supply pipes 32 provided and the number of supply gas flow rate controllers 33 provided are the same as the number of placement tables 2.

The gas supply sections 31 are configured to be connectable to the container inflow sections 11 of the container 1 placed on the placement table 2. As described above, in the present embodiment, a plurality of container inflow sections 11 are provided, and therefore the same number of gas supply sections 31 as the container inflow sections 11 are provided so as to respectively correspond to the plurality of container inflow sections 11. The gas supply sections 31 are located in the placement table 2. In the present embodiment, the gas supply sections 31 are fixed to the placement table 2 so as to protrude upward from the placement table 2. When the container 1 is placed on the placement table 2, the container inflow sections 11 of the container 1 and the gas supply sections 31 located in the placement table 2 are in communication with each other.

The gas supply pipe 32 is connected to the gas supply sections 31. In the present embodiment, the gas supply pipe 32 is branched so as to be connectable to the plurality of gas supply sections 31. The gas supply pipe 32 is configured so that the gas emitted from a supply source (not shown) flows toward the gas supply sections 31. Therefore, when the container inflow sections 11 are connected to the gas supply sections 31, the gas emitted from the supply source flows through the gas supply pipe 32, the gas supply sections 31, and the container inflow sections 11 in the stated order, and is supplied to the inside of the container 1. Note that, in the present embodiment, the container inflow sections 11 are each provided with an inflow on-off valve (not shown) that is urged to be closed by an urging member such as a spring. In the state where the container inflow sections 11 are connected to the gas supply sections 31, when gas is ejected from the container inflow sections 11, the inflow on-off valve is brought into an open state due to the pressure of the gas, and the gas is supplied to the inside of the container 1.

The supply gas flow rate controllers 33 control the gas flow rate so that the flow rate of the gas supplied to the gas supply sections 31 through the gas supply pipe 32 is equal to a predetermined supply gas flow rate Qm1. In this example, each supply gas flow rate controller 33 is a mass flow controller that measures the mass flow rate of the gas flowing through the gas supply pipe 32 and controls the mass flow rate.

The gas exhaust device 4 includes gas exhaust sections 41, a gas exhaust pipe 42, and an exhaust gas flow rate controller 43. In the present embodiment, a plurality of gas exhaust sections 41, a gas exhaust pipe 42, and an exhaust gas flow rate controller 43 are provided for each of the plurality of placement tables 2. That is to say, in the present embodiment, the number of gas exhaust sections 41 provided is a multiple of the number of placement tables 2, and the number of gas exhaust pipes 42 provided and the number of exhaust gas flow rate controllers 43 provided are the same as the number of placement tables 2.

The gas exhaust sections 41 are configured to be connectable to the container outflow sections 12 of the container 1 placed on the placement table 2. As described above, in the present embodiment, a plurality of container outflow sections 12 are provided, and therefore the same number of gas exhaust sections 41 as the container outflow sections 12 are provided so as to respectively correspond to the plurality of container outflow sections 12. The gas exhaust sections 41 are located in the placement table 2. In the present embodiment, the gas exhaust sections 41 are fixed to the placement table 2 so as to protrude upward from the placement table 2. When the container 1 is placed on the placement table 2, the container outflow sections 12 of the container 1 and the gas exhaust sections 41 located in the placement table 2 are in communication with each other.

The gas exhaust pipe 42 is connected to the gas exhaust sections 41. In the present embodiment, the gas exhaust pipe 42 is branched so as to be connectable to the plurality of gas exhaust sections 41. The gas exhaust pipe 42 is configured so that the gas exhausted from the gas exhaust sections 41 flows therethrough. The exhaust pipe 42 is provided with a gas flow generator 45 that generates a gas flow from the gas exhaust sections 41 toward the gas exhaust pipe 42. In this example, the gas flow generator 45 is an ejector that generates a negative pressure by injecting a fluid at a high speed.

In the state where the container outflow sections 12 are connected to the gas exhaust sections 41, when a gas flow is generated by the gas flow generator 45, the gas in the container 1 flows through the container outflow sections 12, the gas exhaust sections 41, and the gas exhaust pipe 42 in the stated order, and is exhausted from the container 1. Note that, in the present embodiment, the container outflow sections 12 are each provided with an outflow on-off valve (not shown) that is urged to be closed by an urging member such as a spring. In the state where the container outflow sections 12 are connected to the gas exhaust sections 41, when a gas flow is generated by the gas flow generator 45, the outflow on-off valve is brought into an open state due to the pressure of the gas in the container 1, and the gas in the container 1 flows to the gas exhaust pipe 42 through the container outflow sections 12.

The exhaust gas flow rate controllers 43 control the gas flow rate so that the flow rate of the gas flowing from the gas exhaust sections 41 to the gas exhaust pipe 42 is equal to a predetermined exhaust gas flow rate Qm3. In the present embodiment, each exhaust gas flow rate controller 43 is located upstream of the gas flow generator 45 on the gas exhaust pipe 42. In this example, each exhaust gas flow rate controller 43 includes a flow meter that measures the flow rate of the gas flowing through the gas exhaust pipe 42, and a needle valve that adjusts the flow rate of the gas flowing through the gas exhaust pipe 42.

Figure 2:
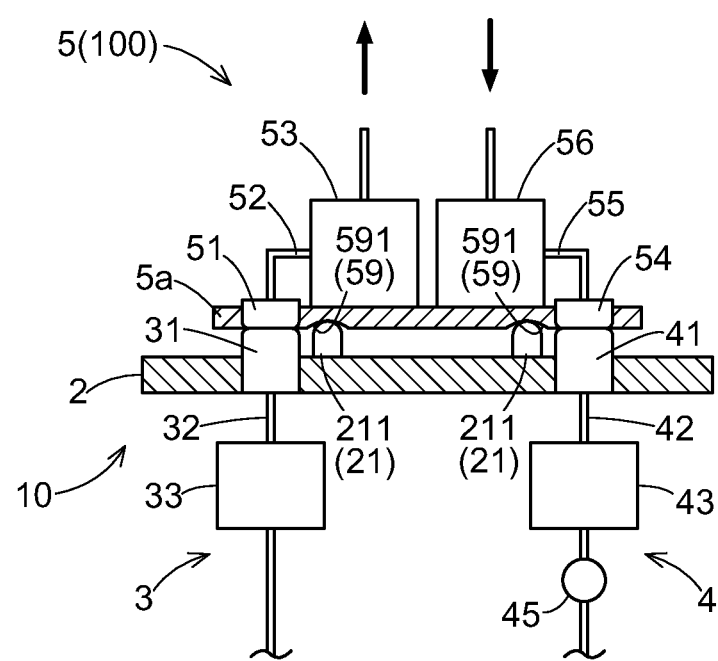
FIG. 2 is a schematic diagram showing an overall configuration of an inspection system according to the embodiment.

Next, the inspection system 100 will be described. As shown in FIG. 2, the inspection system 100 includes an inspection unit 5 that is placeable on the placement table 2.

In the present embodiment, the inspection unit 5 includes inspection inflow sections 51, an inflow pipe 52, an inflow rate measurer 53, inspection outflow sections 54, an outflow pipe 55, and an outflow rate measurer 56.

The inspection inflow sections 51 are connected to the gas supply sections 31 with the inspection unit 5 being placed on the placement table 2. The inspection outflow sections 54 are connected to the gas exhaust sections 41 with the inspection unit 5 being placed on the placement table 2. When the inspection unit 5 is placed on the placement table 2, the gas supply sections 31 and the inspection inflow sections 51 located on the placement table 2 are in communication with each other, and at the same time, the gas exhaust sections 41 and the inspection outflow sections 54 located on the placement table 2 are in communication with each other.

In the present embodiment, the inspection inflow sections 51 have the same shape and configuration as the container inflow sections 11. Specifically, in the present embodiment, the inspection inflow sections 51 are each provided with the above-described inflow on-off valve. Also, in the present embodiment, the same number of inspection inflow sections 51 as the container inflow sections 11 are provided. The plurality of inspection inflow sections 51 are arranged so that the positional relationship between the plurality of inspection inflow sections 51 is the same as the positional relationship between the plurality of container inflow sections 11.

Also, in the present embodiment, the inspection outflow sections 54 have the same shape and configuration as the container outflow sections 12. Specifically, in the present embodiment, the inspection outflow sections 54 are each provided with the above-described outflow on-off valve. Also, in the present embodiment, the same number of inspection outflow sections 54 as the container outflow sections 12 are provided. The plurality of inspection outflow sections 54 are arranged so that the positional relationship between the plurality of inspection outflow sections 54 is the same as the positional relationship between the plurality of container outflow sections 12.

The inflow pipe 52 is connected to the inspection inflow sections 51. In the present embodiment, the inflow pipe 52 is branched so as to be connectable to the plurality of inspection inflow sections 51. The outflow pipe 55 is connected to the inspection outflow sections 54. In the present embodiment, the outflow pipe 55 is branched so as to be connectable to the plurality of inspection outflow sections 54.

The inflow rate measurer 53 is configured to be capable of measuring an inflow rate Qm2 that is the flow rate of the gas flowing therein from the inspection inflow sections 51. In the present embodiment, the inflow rate measurer 53 measures the inflow rate Qm2 of the gas flowing through the inflow pipe 52. In this example, the inflow rate measurer 53 is a mass flow meter that measures the mass flow rate of the gas flowing through the inflow pipe 52.

The outflow rate measurer 56 is configured to be capable of measuring an outflow rate Qm4 that is the flow rate of the gas flowing to the inspection outflow sections 54. In the present embodiment, the outflow rate measurer 56 measures the outflow rate Qm4 of the gas flowing through the outflow pipe 55. In this example, the outflow rate measurer 56 includes a flow meter that measures the flow rate of the gas flowing through the outflow pipe 55, and a needle valve that adjusts the flow rate of the gas flowing through the outflow pipe 55.

In the present embodiment, the inflow pipe 52 is open to the atmosphere at a position that is downstream of a measurement point where the inflow rate Qm2 is measured by the inflow rate measurer 53. Therefore, in the present embodiment, when the inspection inflow sections 51 are connected to the gas supply sections 31, the gas emitted from the supply source flows through the gas supply pipe 32, the gas supply sections 31, the inspection inflow sections 51, and the inflow pipe 52 in the stated order, and is thereafter emitted to the atmosphere.

In addition, in the present embodiment, the outflow pipe 55 is open to the atmosphere at a position that is upstream of a measurement point where the outflow rate Qm4 is measured by the outflow rate measurer 56. Therefore, in the present embodiment, when a gas flow is generated by the gas flow generator 45 with the inspection outflow sections 54 being connected to the gas exhaust sections 41, the gas around the portion of the outflow pipe 55 that is open to the atmosphere is sucked by the outflow pipe 55, and thereafter flows through the inspection outflow sections 54, the gas exhaust sections 41, and the gas exhaust pipe 42 in the stated order.

In this embodiment, the inspection unit 5 includes a base 5a that is placeable on the placement table 2. In the example shown in the drawings, the base 5a is formed in a plate shape that extends in the horizontal direction (the left-right direction in FIG. 2). In the present embodiment, the inspection inflow sections 51 and the inspection outflow sections 54 are fixed to the base 5a so as to penetrate through the base 5a in the vertical direction (the top-bottom direction in FIG. 2). In addition, the inflow rate measurer 53 and the outflow rate measurer 56 are fixed to the base 5a in the state of being placed on the base 5a.

In addition, in the present embodiment, the inspection unit 5 includes an inspection guided section 59 that is configured to be guided by the guiding section 21 of the placement table 2. The inspection guided section 59 has the same shape and configuration as the container guided section 13. In the present embodiment, the inspection guided section 59 includes a plurality of inspection recesses 591 that respectively engage with the plurality of pins 211 of the placement table 2. The plurality of inspection recesses 591 are formed so that the lower surface of the base 5a of the inspection unit 5 is recessed upward.

Figure 3:
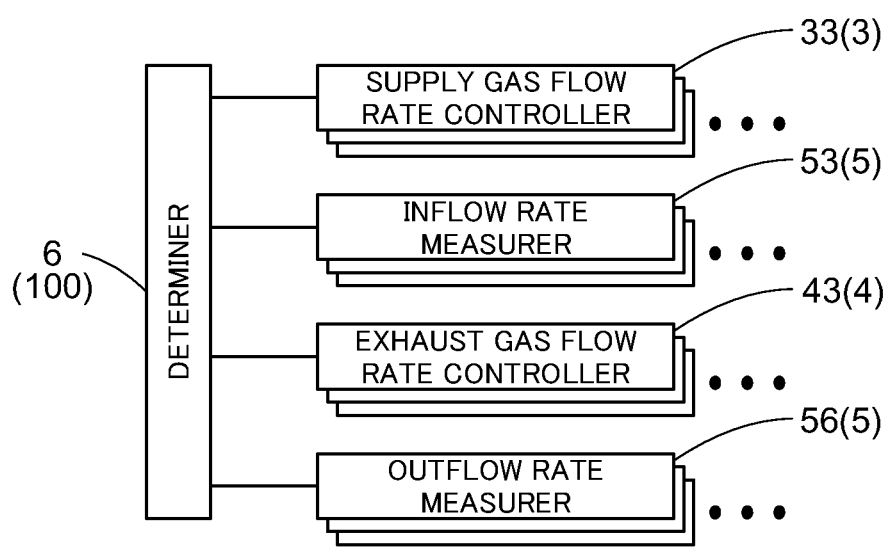
FIG. 3 is a block diagram for the inspection system according to the embodiment.

As shown in FIG. 3, the inspection system 100 includes a determiner 6. In the present embodiment, the determiner 6 is configured to be capable of communicating with the supply gas flow rate controllers 33, the inflow rate measurers 53, the exhaust gas flow rate controllers 43, the outflow rate measurers 56. It is preferable that the determiner 6 is provided in, for example, a control unit (not shown) of the container storage facility 10. Alternatively, the determiner 6 may be provided in the inspection unit 5.

The determiner 6 acquires the supply gas flow rate Qm1 from the supply gas flow rate controllers 33, and acquires the inflow rate Qm2 from the inflow rate measurers 53. The determiner 6 determines the state of leakage of the gas from the junctions of the gas supply sections 31 and the inspection inflow sections 51 based on the difference between the supply gas flow rate Qm1 and the inflow rate Qm2.

In the state where the inspection unit 5 is placed on the placement table 2, when the gas supply sections 31 and the inspection inflow sections 51 are not properly connected to each other, the amount of gas leaked from the junctions of the gas supply sections 31 and the inspection inflow sections 51 is larger and accordingly the inflow rate Qm2 is smaller compared to when the gas supply sections 31 and the inspection inflow sections 51 are properly connected to each other, if the supply gas flow rate Qm1 is the same. Thus, it is possible to determine whether or not the gas supply sections 31 and the inspection inflow sections 51 are properly connected to each other, based on the difference between the supply gas flow rate Qm1 and the inflow rate Qm2. Here, the inspection unit 5 includes the inspection inflow sections 51 that are connectable to the gas supply sections 31, instead of the container inflow sections 11. Therefore, as described above, it is possible to appropriately inspect whether or not there is an abnormality in the placement table 2 or misalignment of the container 1 on the placement table 2 by placing the inspection unit 5 on the placement table 2 instead of the container 1, and determining whether or not the gas supply sections 31 and the inspection inflow sections 51 are properly connected to each other.

In the present embodiment, the determiner 6 acquires the exhaust flow rate Qm3 from the exhaust flow rate controller 43 and the outflow rate Qm4 from the outflow rate measurement section 56. The determiner 6 determines the state of leakage of the gas from the junctions of the gas exhaust sections 41 and the inspection outflow sections 54 based on the difference between the exhaust gas flow rate Qm3 and the outflow rate Qm4.

In the state where the inspection unit 5 is placed on the placement table 2, when the gas exhaust sections 41 and the inspection outflow sections 54 are not properly connected to each other, the amount of gas leaked from the junctions of the gas exhaust sections 41 and the inspection outflow sections 54 is larger and accordingly the outflow rate Qm4 is smaller compared to when the gas exhaust sections 41 and the inspection outflow sections 54 are properly connected to each other, if the exhaust gas flow rate Qm3 is the same. Thus, it is possible to determine whether or not the gas exhaust sections 41 and the inspection outflow sections 54 are properly connected to each other, based on the difference between the exhaust gas flow rate Qm3 and the outflow rate Qm4. Here, the inspection unit 5 includes the inspection outflow sections 54 that are connectable to the gas exhaust sections 41, instead of the container outflow sections 12. Therefore, as described above, it is possible to appropriately inspect whether or not there is an abnormality in the placement table 2 or misalignment of the container 1 on the placement table 2 by placing the inspection unit 5 on the placement table 2 instead of the container 1, and determining whether or not the gas exhaust sections 41 and the inspection outflow sections 54 are properly connected to each other.

Figure 4:
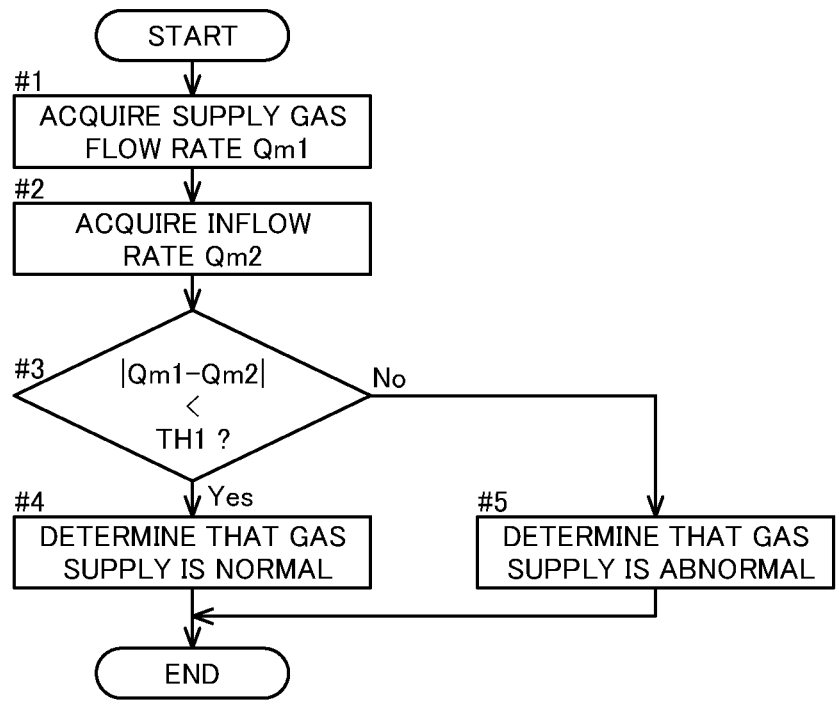
FIG. 4 is a flowchart showing an example of determination processing that is performed by a determiner according to the embodiment.
Figure 5:
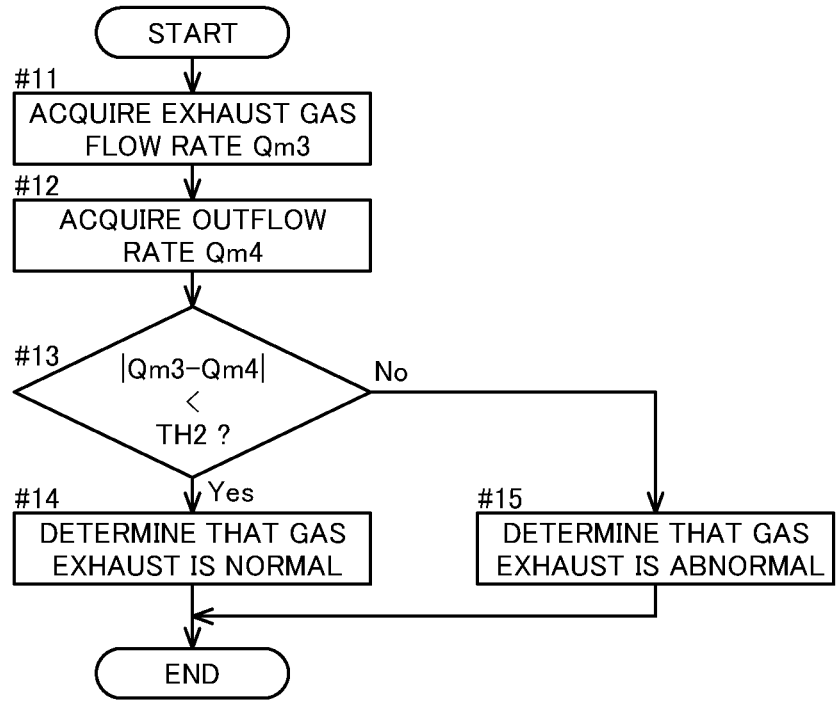
FIG. 5 is a flowchart showing an example of determination processing that is performed by the determiner according to the embodiment.

Hereinafter, the determination processing performed by the determiner 6 will be described with reference to FIGS. 4 and 5. FIGS. 4 and 5 are flowcharts showing examples of the determination processing performed by the determiner 6. Specifically, FIG. 4 is a flowchart showing an example of the processing through which the determiner 6 determines the state of leakage of the gas from the junctions of the gas supply sections 31 and the inspection inflow sections 51. FIG. 5 is a flowchart showing an example of the processing through which the determiner 6 determines the state of leakage of the gas from the junctions of the gas exhaust sections 41 and the inspection outflow sections 54.

As shown in FIG. 4, for determination regarding gas supply, the determiner 6 first acquires the supply gas flow rate Qm1 from the supply gas flow rate controllers 33 (step #1). Next, the determiner 6 acquires the inflow rate Qm2 from the inflow rate measurers 53 (step #2).

Subsequently, the determiner 6 determines whether or not the difference between the supply gas flow rate Qm1 and the inflow rate Qm2 is less than a predetermined first threshold value TH1 (|Qm1−Qm2|<TH1) (step #3).

Upon determining that the difference between the supply gas flow rate Qm1 and the inflow rate Qm2 is less than the first threshold value TH1 (|Qm1−Qm2|<TH1) (step #3: Yes), the determiner 6 determines that the gas supply sections 31 and the inspection inflow sections 51 are properly connected to each other and gas supply is normal (step #4).

On the other hand, upon determining that the difference between the supply gas flow rate Qm1 and the inflow rate Qm2 is no less than the first threshold value TH1 (|Qm1−Qm2|≥TH1) (step #3: No), the determiner 6 determines that the gas supply sections 31 and the inspection inflow sections 51 are not properly connected to each other and an abnormality has occurred in gas supply (step #5).

As shown in FIG. 5, for determination regarding gas exhaust, the determiner 6 first acquires the exhaust gas flow rate Qm3 from the exhaust gas flow rate controllers 43 (step #11). Next, the determiner 6 acquires the outflow rate Qm4 from the outflow rate measurers 56 (step #12).

Subsequently, the determiner 6 determines whether or not the difference between the exhaust gas flow rate Qm3 and the outflow rate Qm4 is less than a predetermined second threshold value TH2 (|Qm3−Qm4|<TH2) (step #13).

Upon determining that the difference between the exhaust gas flow rate Qm3 and the outflow rate Qm4 is less than the second threshold value TH2 (|Qm3−Qm4|<TH2) (step #13: Yes), the determiner 6 determines that the gas exhaust sections 41 and the inspection outflow sections 54 are properly connected to each other and gas exhaust is normal (step #14).

On the other hand, upon determining that the difference between the exhaust gas flow rate Qm3 and the outflow rate Qm4 is no less than the second threshold value TH2 (|Qm3−Qm4|≥TH2) (step #13: No), the determiner 6 determines that the gas exhaust sections 41 and the inspection outflow sections 54 are not properly connected to each other and an abnormality has occurred in gas exhaust (step #15).

Other Embodiments (1) The above embodiment describes an example of a configuration in which the determiner 6 determines both the state of leakage of the gas from the junctions of the gas supply sections 31 and the inspection inflow sections 51 and the state of leakage of the gas from the junctions of the gas exhaust sections 41 and the inspection outflow sections 54. However, the present invention is not limited to such a configuration, and it is possible to employ a configuration in which the determiner 6 determines either the state of leakage of the gas from the junctions of the gas supply sections 31 and the inspection inflow sections 51 or the state of leakage of the gas from the junctions of the gas exhaust sections 41 and the inspection outflow sections 54.

(2) Although the above embodiment describes an example of a configuration in which the gas supply device 3 is provided with a plurality of gas supply sections 31, the number of gas supply sections 31 is not limited. For example, it is possible to employ a configuration in which the gas supply device 3 is provided with only one gas supply section 31. With the present configuration, it is preferable that the container 1 is provided with only one container inflow section 11, and the inspection unit 5 is provided with only one inspection inflow section 51. Also, although the above embodiment describes an example of a configuration in which the gas exhaust device 4 is provided with a plurality of gas exhaust sections 41, the number of gas exhaust sections 41 is not limited. For example, it is possible to employ a configuration in which the gas exhaust device 4 is provided with only one gas exhaust section 41. With the present configuration, it is preferable that the container 1 is provided with only one container outflow section 12, and the inspection unit 5 is provided with only one inspection outflow section 54.

(3) The above embodiment describes an example in which the placement table 2 is provided with a plurality of pins 211 that serve as the guiding section 21, and the container 1 is provided with a plurality of container recesses 131 that serve as the container guided section 13. However, the present invention is not limited to such a configuration, and, for example, it is possible to employ a configuration in which the placement table 2 is provided with, as the guiding section 21, a restriction member that comes into contact with the container 1 sideways and restrict the container 1 from moving in the horizontal direction. With the present configuration, it is preferable that the restriction member comes into contact with a portion (for example, the base 5a) of the inspection unit 5 sideways and restricts the inspection unit 5 from moving in the horizontal direction. In addition, it is possible to employ a configuration in which the placement table 2 is not provided with the guiding section 21 and the container 1 is not provided with the container guided section 13.

(4) The above embodiment describes an example of a configuration in which the inspection inflow sections 51 and the container inflow sections 11 have the same shape and configuration. However, the present invention is not limited to such a configuration, and the shapes and configurations of the inspection inflow sections 51 and the container inflow sections 11 may be at least partially different. Also, the above embodiment describes an example of a configuration in which the inspection outflow sections 54 and the container outflow sections 12 have the same shape and configuration. However, the present invention is not limited to such a configuration, and the shapes and configurations of the inspection outflow sections 54 and the container outflow sections 12 may be at least partially different.

(5) The above embodiment describes an example of a configuration in which the inflow pipe 52 is open to the atmosphere at a position that is downstream of a measurement point where the inflow rate Qm2 is measured by the inflow rate measurer 53, and the outflow pipe 55 is open to the atmosphere at a position that is upstream of a measurement point where the outflow rate Qm4 is measured by the outflow rate measurer 56. However, the present invention is not limited to such a configuration, and, for example, it is possible to employ a configuration in which a portion of the inflow pipe 52 located at a position that is downstream of a measurement point where the inflow rate Qm2 is measured by the inflow rate measurer 53 and a portion of the outflow pipe 55 located at a position that is upstream of a measurement point where the outflow rate Qm4 is measured by the outflow rate measurer 56 are connected to a connection pipe that is different from these pipes, and the connection pipe is open to the atmosphere. Alternatively, the inflow pipe 52 and the outflow pipe 55 may be connected to each other by a connection pipe. In such a case, the connection pipe may be branched and the branch portion may be open to atmosphere.

(6) Note that the configurations disclosed in the above embodiments may be applied in combination with the configurations disclosed in other embodiments as long as no contradiction arises. With respect to other configurations, the embodiments disclosed herein are merely exemplary in all respects. Therefore, various modifications can be appropriately made without departing from the spirit of the present disclosure.

SUMMARY OF THE ABOVE EMBODIMENTS

Hereinafter, a summary of the inspection system described above will be described.

An inspection system is an inspection system that inspects a flow of gas in a container storage facility that includes: a placement table on which a container is placeable; and a gas supply device configured to supply the gas to the container placed on the placement table, the inspection system including:

an inspection unit that is placeable on the placement table; and a determiner, wherein the container includes a container inflow section in which an inflow port for the gas is formed, the gas supply device includes: a gas supply section located in the placement table so as to be connectable to the container inflow section of the container placed on the placement table; a gas supply pipe connected to the gas supply section; and a supply gas flow rate controller configured to control a flow rate of the gas so that the flow rate of the gas supplied to the gas supply section through the gas supply pipe is equal to a predetermined supply gas flow rate, the inspection unit includes: an inspection inflow section that is connectable to the gas supply section while the inspection unit is placed on the placement table; and an inflow rate measurer configured to measure an inflow rate that is a flow rate of the gas flowing thereto from the inspection inflow section, and the determiner is configured to determine a state of leakage of the gas from a junction of the gas supply section and the inspection inflow section based on a difference between the supply gas flow rate and the inflow rate.

With the present configuration, when the inspection unit is placed on the placement table instead of a container, gas flows through the gas supply pipe, the gas supply section, and the inspection inflow section in the stated order. At this time, if the gas supply section and the inspection inflow section are not properly connected to each other, the amount of gas leaked from the junction of the gas supply section and the inspection inflow section is larger and accordingly the inflow rate is smaller compared to when the gas supply section and the inspection inflow section are properly connected to each other, if the supply gas flow rate is the same. Thus, with the present configuration, it is possible to determine whether or not the gas supply section and the inspection inflow section are properly connected to each other, based on the difference between the supply gas flow rate and the inflow rate. Here, the inspection unit includes an inspection inflow section that is connectable to the gas supply section, instead of the container inflow section. Therefore, as described above, it is possible to appropriately inspect whether or not there is an abnormality in the placement table or misalignment of the container on the placement table by placing the inspection unit on the placement table instead of the container, and determining whether or not the gas supply section and the inspection inflow section are properly connected to each other.

Here, it is preferable that the placement table includes a guiding section configured to guide the container to a predetermined position on the placement table, the container includes a container guided section configured to be guided by the guiding section, the inspection unit includes an inspection guided section having a shape and configuration corresponding to those of the container guided section and configured to be guided by the guiding section, and the inspection inflow section has a shape and configuration corresponding to those of the container inflow section.

With the present configuration, when the inspection unit is placed on the placement table, the inspection guided section of the inspection unit is guided by the guiding section of the placement table in the same manner that the container guided section of the container placed on the placement table is guided by the guiding section of the placement table.

Also, with the present configuration, when the inspection unit is placed on the placement table, the gas supply section is connected to the inspection inflow section of the inspection unit in the same manner that the gas supply section is connected to the container inflow section of the container placed on the placement table.

As described above, with the present configuration, it is possible to inspect the flow of the gas while accurately reproducing the situation in which a container is placed on the placement table.

In addition, it is preferable that the inspection unit further includes an inflow pipe connected to the inspection inflow section, the inflow rate measurer is configured to measure the inflow rate of the gas flowing through the inflow pipe, and the inflow pipe is open to an atmosphere at a position that is downstream of a measurement point where the inflow rate is measured by the inflow rate measurer.

Generally, each container of the container storage facility is configured so that the gas leaks from a gap if the gas is continuously supplied thereto even after the container is saturated with the gas. That is to say, the gas flow path is open to the atmosphere at a position that is downstream of the container inflow section. With the present configuration, the inflow pipe is open to the atmosphere at a position that is downstream of the measurement point where the inflow rate is measured by the inflow rate measurer. Therefore, it is possible to inspect the flow of the gas while accurately reproducing the situation in which a container is placed on the placement table.

Also, it is preferable that the container storage facility further includes a gas exhaust device configured to exhaust the gas from the container placed on the placement table, the container further includes a container outflow section in which an outflow port for the gas is formed, the gas exhaust device includes: a gas exhaust section located in the placement table so as to be connectable to the container outflow section of the container placed on the placement table; an exhaust pipe connected to the gas exhaust section; and an exhaust gas flow rate controller configured to control a flow rate of the gas so that the flow rate of the gas flowing from the gas exhaust section to the gas exhaust pipe is equal to a predetermined exhaust gas flow rate, the inspection unit further includes: an inspection outflow section that is connectable to the gas exhaust section while the inspection unit is placed on the placement table; and an outflow rate measurer configured to measure an outflow rate that is a flow rate of the gas flowing to the inspection outflow section, and the determiner is configured to determine a state of leakage of the gas from a junction of the gas exhaust section and the inspection outflow section based on a difference between the exhaust gas flow rate and the outflow rate.

With the present configuration, when the inspection unit is placed on the placement table instead of a container, gas flows through the inspection outflow section, the gas exhaust section, and the gas exhaust pipe in the stated order. At this time, if the gas exhaust section and the inspection outflow section are not properly connected to each other, the amount of gas leaked from the junction of the gas exhaust section and the inspection outflow section is larger and accordingly the outflow rate is smaller compared to when the gas exhaust section and the inspection outflow section are properly connected to each other, if the exhaust gas flow rate is the same. Thus, with the present configuration, it is possible to determine whether or not the gas exhaust section and the inspection outflow section are properly connected to each other, based on the difference between the exhaust gas flow rate and the outflow rate. Here, the inspection unit includes an inspection outflow section that is connectable to the gas exhaust section, instead of the container outflow section. Therefore, as described above, it is possible to more precisely inspect whether or not there is an abnormality in the placement table or misalignment of the container on the placement table by placing the inspection unit on the placement table instead of the container, and determining whether or not the gas exhaust section and the inspection outflow section are properly connected to each other, in addition to determining whether or not the gas supply section and the inspection inflow section are properly connected to each other.

An inspection system is an inspection system that inspects a flow of gas in a container storage facility that includes: a placement table on which a container is placeable; and a gas exhaust device configured to exhaust the gas from the container placed on the placement table, the inspection system including:

an inspection unit that is placeable on the placement table; and a determiner, wherein the container includes a container outflow section in which an outflow port for the gas is formed, the gas exhaust device includes: a gas exhaust section located in the placement table so as to be connectable to the container outflow portion of the container placed on the placement table; an exhaust pipe connected to the gas exhaust section; and an exhaust gas flow rate controller configured to control a flow rate of the gas so that the flow rate of the gas flowing from the gas exhaust section to the gas exhaust pipe equals a predetermined exhaust gas flow rate, the inspection unit includes: an inspection outflow section that is connectable to the gas exhaust section while the inspection unit is placed on the placement table; and an outflow rate measurer configured to measure an outflow rate that is a flow rate of the gas flowing to the inspection outflow section, and the determiner is configured to determine a state of leakage of the gas from a junction of the gas exhaust section and the inspection outflow section based on a difference between the exhaust gas flow rate and the outflow rate.

With the present configuration, when the inspection unit is placed on the placement table instead of a container, gas flows through the inspection outflow section, the gas exhaust section, and the gas exhaust pipe in the stated order. At this time, if the gas exhaust section and the inspection outflow section are not properly connected to each other, the amount of gas leaked from the junction of the gas exhaust section and the inspection outflow section is larger and accordingly the outflow rate is smaller compared to when the gas exhaust section and the inspection outflow section are properly connected to each other, if the exhaust gas flow rate is the same. Thus, with the present configuration, it is possible to determine whether or not the gas exhaust section and the inspection outflow section are properly connected to each other, based on the difference between the exhaust gas flow rate and the outflow rate. Here, the inspection unit includes an inspection outflow section that is connectable to the gas exhaust section, instead of the container outflow section. Therefore, as described above, it is possible to appropriately inspect whether or not there is an abnormality in the placement table or misalignment of the container on the placement table by placing the inspection unit on the placement table instead of the container, and determining whether or not the gas exhaust section and the inspection outflow section are properly connected to each other.

Here, it is preferable that the placement table includes a guiding section configured to guide the container to a predetermined position on the placement table,
  the container includes a container guided section configured to be guided by the guiding section,
  the inspection unit includes an inspection guided section having a shape and configuration corresponding to those of the container guided section and configured to be guided by the guiding section, and
  the inspection outflow section has a shape and configuration corresponding to those of the container outflow section.

With the present configuration, when the inspection unit is placed on the placement table, the inspection guided section of the inspection unit is guided by the guiding section of the placement table in the same manner that the container guided section of the container placed on the placement table is guided by the guiding section of the placement table.

Also, with the present configuration, when the inspection unit is placed on the placement table, the gas exhaust section is connected to the inspection outflow section of the inspection unit in the same manner that the gas exhaust section is connected to the container outflow section of the container placed on the placement table.

As described above, with the present configuration, it is possible to inspect the flow of the gas while accurately reproducing the situation in which a container is placed on the placement table.

Also, it is preferable that the inspection unit further includes an outflow pipe connected to the inspection outflow section,
  the outflow rate measurer is configured to measure the outflow rate of the gas flowing through the outflow pipe, and
  the outflow pipe is open to an atmosphere at a position that is upstream of a measurement point where the outflow rate is measured by the outflow rate measurer.

Generally, each container of the container storage facility is configured so that the gas leaks from a gap if the gas is continuously supplied thereto even after the container is saturated with the gas. That is to say, the gas flow path is open to the atmosphere at a position that is upstream of the container outflow section. With the present configuration, the outflow pipe is open to the atmosphere at the position that is upstream of the measurement point where the outflow rate is measured by the outflow rate measurer. Therefore, it is possible to inspect the flow of the gas while accurately reproducing the situation in which a container is placed on the placement table.

Industrial Applicability

The technology according to the present disclosure is applicable to an inspection system that inspects a gas flow in a container storage facility that includes: a placement table on which a container is placeable; and a gas supply device configured to supply gas to a container placed on the placement table.

What is claimed is:

1. An inspection system that inspects a flow of gas in a container storage facility comprising a placement table on which a container is placeable, and a gas supply device configured to supply the gas to the container placed on the placement table, the inspection system comprising:
  an inspection unit that is placeable on the placement table; and
  a determiner,
  wherein:
    the container comprises a container inflow section in which an inflow port for the gas is formed,
    the gas supply device comprises:
      a gas supply section located in the placement table so as to be connectable to the container inflow section of the container placed on the placement table;
      a gas supply pipe connected to the gas supply section; and
      a supply gas flow rate controller configured to control a flow rate of the gas so that the flow rate of the gas supplied to the gas supply section through the gas supply pipe is equal to a predetermined supply gas flow rate,
    the inspection unit comprises:
      an inspection inflow section that is connectable to the gas supply section while the inspection unit is placed on the placement table;
      an inflow pipe connected to the inspection inflow section; and
      an inflow rate measurer configured to measure an inflow rate that is a flow rate of the gas flowing through the inflow pipe from the inspection inflow section, wherein the inflow pipe is open to an atmosphere at a position that is downstream of a measurement point where the inflow rate is measured by the inflow rate measurer, and
    the determiner is configured to determine a state of leakage of the gas from a junction of the gas supply section and the inspection inflow section based on a difference between the supply gas flow rate and the inflow rate.

2. The inspection system according to claim 1, wherein:
  the placement table comprises a guiding section configured to guide the container to a predetermined position on the placement table,
  the container comprises a container guided section configured to be guided by the guiding section,
  the inspection unit comprises an inspection guided section having a shape and configuration corresponding to those of the container guided section and configured to be guided by the guiding section, and the inspection inflow section has a shape and configuration corresponding to those of the container inflow section.

3. The inspection system according to claim 1, wherein:
the container storage facility further comprises a gas exhaust device configured to exhaust the gas from the container placed on the placement table,
the container further comprises a container outflow section in which an outflow port for the gas is formed,
the gas exhaust device comprises:
a gas exhaust section located in the placement table so as to be connectable to the container outflow section of the container placed on the placement table;
an exhaust pipe connected to the gas exhaust section; and
an exhaust gas flow rate controller configured to control a flow rate of the gas so that the flow rate of the gas flowing from the gas exhaust section to the gas exhaust pipe is equal to a predetermined exhaust gas flow rate,
the inspection unit further comprises:
an inspection outflow section that is connectable to the gas exhaust section while the inspection unit is placed on the placement table; and
an outflow rate measurer configured to measure an outflow rate that is a flow rate of the gas flowing to the inspection outflow section, and
the determiner is configured to determine a state of leakage of the gas from a junction of the gas exhaust section and the inspection outflow section based on a difference between the exhaust gas flow rate and the outflow rate.

4. An inspection system that inspects a flow of gas in a container storage facility comprising a placement table on which a container is placeable, and a gas exhaust device configured to exhaust the gas from the container placed on the placement table, the inspection system comprising:
an inspection unit that is placeable on the placement table; and
a determiner,
wherein:
the container comprises a container outflow section in which an outflow port for the gas is formed,
the gas exhaust device comprises:
a gas exhaust section located in the placement table so as to be connectable to the container outflow section of the container placed on the placement table;
an exhaust pipe connected to the gas exhaust section; and
an exhaust gas flow rate controller configured to control a flow rate of the gas so that the flow rate of the gas flowing from the gas exhaust section to the gas exhaust pipe is equal to a predetermined exhaust gas flow rate,
the inspection unit comprises:
an inspection outflow section that is connectable to the gas exhaust section while the inspection unit is placed on the placement table;
an outflow pipe connected to the inspection outflow section; and
an outflow rate measurer configured to measure an outflow rate that is a flow rate of the gas flowing through the outflow pipe to the inspection outflow section, wherein the outflow pipe is open to an atmosphere at a position that is upstream of a measurement point where the outflow rate is measured by the outflow rate measurer, and
the determiner is configured to determine a state of leakage of the gas from a junction of the gas exhaust section and the inspection outflow section based on a difference between the exhaust gas flow rate and the outflow rate.

5. The inspection system according to claim 4, wherein:
the placement table comprises a guiding section configured to guide the container to a predetermined position on the placement table,
the container comprises a container guided section configured to be guided by the guiding section,
the inspection unit comprises an inspection guided section having a shape and configuration corresponding to those of the container guided section and configured to be guided by the guiding section, and
the inspection outflow section has a shape and configuration corresponding to those of the container outflow section.

6. The inspection system according to claim 3, wherein the exhaust pipe is provided with a gas flow generator configured to generate a gas flow from the gas exhaust section toward the exhaust pipe.

7. The inspection system according to claim 4, wherein the exhaust pipe is provided with a gas flow generator configured to generate a gas flow from the gas exhaust section toward the exhaust pipe.

* * * * *